United States Patent [19]

Prancz

[11] Patent Number: 5,996,897
[45] Date of Patent: Dec. 7, 1999

[54] DATA CARRIER HAVING A MODULE INCLUDING A COMPONENT AND HAVING A COIL, AND METHOD OF MANUFACTURING SUCH A DATA CARRIER

[75] Inventor: Markus Prancz, Vienna, Austria

[73] Assignee: Austria Card Plastikkarten Und Ausweissysteme Gesellschaft M.B.H, Vienna, Austria

[21] Appl. No.: 09/011,155

[22] PCT Filed: Jul. 15, 1996

[86] PCT No.: PCT/IB96/00690

§ 371 Date: Jan. 29, 1998

§ 102(e) Date: Jan. 29, 1998

[87] PCT Pub. No.: WO97/05569

PCT Pub. Date: Feb. 13, 1997

[30] Foreign Application Priority Data

Aug. 1, 1995 [AT] Austria .................................. 422/95 U

[51] Int. Cl.[6] .................................................. G06K 19/06
[52] U.S. Cl. .......................... 235/492; 257/679; 343/741
[58] Field of Search .................................... 235/492, 486, 235/487, 491, 380; 902/26; 343/741, 742, 743, 744; 259/679

[56] References Cited

U.S. PATENT DOCUMENTS

| 5,550,709 | 8/1996 | Iwasaki | 235/492 X |
| 5,598,032 | 1/1997 | Fidalgo | 235/492 X |
| 5,612,532 | 3/1997 | Iwasaki | 235/492 |
| 5,671,525 | 9/1997 | Fidalgo | 235/492 X |
| 5,710,458 | 1/1998 | Iwasaki | 235/491 X |
| 5,822,190 | 10/1998 | Iwasaki | 235/488 X |

FOREIGN PATENT DOCUMENTS

0682321A2  11/1995  European Pat. Off. .

*Primary Examiner*—Michael G Lee

[57] ABSTRACT

A data carrier has a data carrier body. A component module with component contacts and a coil with coil contacts are incorporated in the data carrier body. The component is located in a component level zone. At least in their area adjacent the component module, the coil and the coil contacts are located in a winding level zone that is situated outside the component level zone. The component contacts and the coil contacts are connected through a dried electrically conductive adhesive that was introduced into channels between the coil and component contacts in a pasty or a liquid condition upon manufacturing of the data carrier. At the surface of the data carrier, adjacent the channel the data carrier has pockets that are adapted to receive a surplus of electrically conductive adhesive more than necessary than to form the channels of dried electrically conductive adhesive.

20 Claims, 3 Drawing Sheets

DATA CARRIER HAVING A MODULE INCLUDING A COMPONENT AND HAVING A COIL, AND METHOD OF MANUFACTURING SUCH A DATA CARRIER

BACKGROUND OF THE INVENTION

The invention relates to a data carrier comprising a data carrier body bounded by a body surface and incorporating a module and a coil, which coil is separate from the module and has coil turns and at least two coil connecting contacts, the module comprising a plate-shaped carrier, which extends substantially parallel to said body surface and which is bounded by a first carrier main surface facing said body surface and by a second carrier main surface substantially parallel to the first carrier main surface, and at least one component, which component is incorporated in the data carrier body, is connected to the carrier, is raised with respect to the second carrier main surface, and is disposed in a component level zone which extends transversely to said body surface, and at least two module connecting contacts connected to the carrier and arranged in the area of the second carrier main surface, and the coil turns and the coil connecting contacts of the coil being disposed in a winding level zone which extends transversely to said body surface and each coil connecting contact being disposed opposite a module connecting contact in a direction transverse to the second carrier main surface and being connected to the last-mentioned connecting contact in an electrically conductive manner.

The invention further relates to a method of manufacturing a data carrier, in which a data carrier body is manufactured, which data carrier body is bounded by a body surface and in which during the manufacture of the data carrier body a coil having coil turns and at least two coil connecting contacts is incorporated in the data carrier body, which coil turns and coil connecting contacts are arranged in a winding level zone which extends transversely to said body surface, and in which a module is incorporated in the data carrier body, which module comprises a plate-shaped carrier, which is bounded by a first carrier main surface and by a second carrier main surface substantially parallel to the first carrier main surface, and a component, which is connected to the carrier and is raised with respect to the second carrier main surface, and at least two module connecting contacts connected to the carrier and arranged in the area of the second carrier main surface, the first carrier main surface then facing said body surface and the second carrier main surface then being remote from said body surface and the component then being disposed in a component level zone which extends transversely to said body surface, and each module connecting contact and each coil connecting contact then being disposed opposite one another in a direction transverse to the second carrier main surface and being connected in an electrically conductive manner.

Such a data carrier of the type defined in the first paragraph and constructed as a chip card and a method of the type defined in the second paragraph are known from, for example, the document EP 0 682 321 A2.

FIGS. 1 and 2 in the document EP 0 682 321 A2 disclose a chip card which is manufactured in a customary lamination technique and whose data carrier body is formed by a card body and in which the chip, which forms part of a module and which is incorporated in the card body of the chip card, is arranged in the area of a second carrier main surface of a chip carrier which also forms part of the module, and is raised with respect to this second carrier main surface, but in which the module connecting contacts are arranged on a first carrier main surface, which is effected because a coil incorporated in the card body is disposed in a winding level zone, both with its coil turns and with its coil connecting contacts, which are conductively connected to the module connecting contacts, said winding level zone being situated between a first body main surface of the card body, to be regarded as said body surface, and the first carrier main surface of the carrier. With this known chip card it is therefore necessary to provide electrically conductive connections, which pass through the carrier, between the chip, or rather its chip connecting contacts, and the module connecting contacts, which represents an additional step, making the fabrication of the module comprising the carrier and the chip as well as the module Connecting contacts more expensive and, consequently, making the chip card more expensive.

FIGS. 3 and 4 in the document EP 0 682 321 A2 disclose another known chip card, which is also manufactured in a customary lamination technique and which has a data carrier body formed by a card body and which comprises a module in which a chip as a component of the module is arranged in the area of a second carrier main surface of a carrier of the module and is raised with respect to this second carrier main surface and in which the module connecting contacts as well as the chip are arranged in the area of this second carrier main surface, which is effected because a coil is disposed in a winding level zone, both with its coil turns and with its coil connecting contacts, which are conductively connected to the module connecting contacts, said winding level zone being situated between the second carrier main surface of the carrier and a second body main surface of the card body, which last-mentioned surface is disposed opposite the first body main surface. In this known chip card, however, the coil is disposed with its coil turns and its coil connecting contacts in a winding level zone situated within the component level zone, as a result of which the coil turns in the area in which the chip is situated must be arranged to bypass the chip, but owing to the extremely limited geometrical proportions in this area this gives rise to problems in the design of the coil as regards the coil turn layout in this area.

SUMMARY OF THE INVENTION

It is an object of the invention to preclude the aforementioned problems and difficulties in a simple manner and by simple means and to improve a data carrier of the type defined in the first paragraph and a method of the type defined in the second paragraph so as to obtain an improved data carrier in which the presence of a component of the module does not impose any restrictions on the arrangement of the coil turns of the coil and in which, in spite of this, a very simple and cheap yet reliable electrical connection is obtained between the coil connecting contacts and the module connecting contacts which are connected thereto in an electrically conductive manner.

According to the invention, in order to achieve the aforementioned object in a data carrier of the type defined in the first paragraph, the coil turns and the coil connecting contacts of the coil, at least in their area adjacent the component, are disposed in a winding level zone situated outside the component level zone, and between each module connecting contact and its facing coil connecting contact a channel has been provided which adjoins the two connecting contacts, and each channel contains an electrically conductive connecting means which forms the electrically conductive connection between a module connecting contact and a coil connecting contact.

Owing to the measures in accordance with the invention it is achieved in a very simple and cheap manner and substantially without any additional means that no restrictions are imposed on the arrangement of the coil turns of the coil and the construction of the coil by the presence of a component of the module and, moreover, that the coil connecting contacts and the module connecting contacts, which are electrically connected to the first-mentioned connecting contacts, are interconnected in a reliable manner, and that no special measures are required as regards the arrangement of the module connecting contacts on the carrier of the module and the connection of these contacts to the component, i.e. to the component connecting contacts.

In a data carrier in accordance with the invention, a pin made of an electrically conductive material and introduced into a channel of the data carrier may be arranged in each channel as an electrically conductive connecting means. However, it has proved to be very advantageous if each channel contains an electrically conductive substance as the electrically conductive connecting means which can be introduced into the channel in a pasty or liquid condition. Thus, it is achieved that each channel is wholly filled with the electrically conductive substance, which is advantageous both in view of a high mechanical stability and in view of a proper electrical connection.

In a data carrier in accordance with the invention as defined in the preceding paragraph it has proved to be particularly advantageous if each channel contains an electrically conductive adhesive as the electrically conductive connecting means. In this way, it is achieved that the connecting means serve not only for the electrical connection but also a proper and stable adhesive mechanical connection which secures the module to the card body of the data carrier via the module connecting contacts.

In a data carrier in accordance with the invention, in which each channel contains an electrically conductive substance as the electrically conductive connecting means which can be introduced into the channel in a pasty or liquid condition, it has proved to be particularly advantageous if at its end which is remote from its adjacent coil connecting contact and which faces its adjacent module connecting contact each channel has a pocket which extends in a lateral direction away from the channel and which is adapted to receive a surplus of electrically conductive substance. In this way, it is achieved that surplus electrically conductive substance introduced into a channel can be taken up in the pocket which extends away from the channel in a lateral direction, thereby precluding soiling as a result of the introduction of a surplus of electrically conductive substance into a channel.

In a data carrier in accordance with the invention it has further proved to be very advantageous if the data carrier has a stepped recess which terminates in said body surface and has a cross-sectionally larger first recess portion, which adjoins said body surface and is bounded by an annular bounding surface parallel to said body main surface, and a cross-sectionally smaller second recess portion, which adjoins the first recess portion at the side which is remote from said body surface and which accommodates the module, an annular portion of the second carrier main surface of the carrier of the module facing the annular bounding surface of the first recess portion, and the module connecting contacts are disposed at least partly in the area of the annular portion of the second carrier main surface, and the channels extend from the annular bounding surface of the first recess portion up to the coil connecting contacts through the data carrier body. Such an embodiment has proved to be very favorable for a very low-cost production.

In a data carrier in accordance with the invention as defined in the preceding paragraph it has proved to be particularly advantageous if the recess and the channels have been formed by means of a milling operation. This is particularly advantageous for a high-precision fabrication of the recess for receiving the module and the channels to the coil connecting contacts.

In a data carrier in accordance with the invention, in which the coil connecting contacts together with the coil turns of the coil are disposed in the winding level zone, it has further proved to be particularly advantageous if the coil turns and the coil connecting contacts of the coil are constituted by conductor tracks formed by means of a screen-printing process. In this way, the advantages of screen-printing processes, whose use for the manufacture of coils for data carriers is known per se, can also be utilized favorably in a data carrier in accordance with the invention.

In the context given above it has further proved to be very advantageous if the coil turns and the coil connecting contacts of the coil are constituted by conductor tracks formed by means of a screen-printing process using a conductive silver paste. This has proved to be particularly favorable in practice.

In a data carrier in accordance with the invention, in which a module carrying a component is mounted in a recess which opens into a body surface of the data carrier body, in which case the first carrier main surface of the carrier of the module, in a customary manner, can be scanned mechanically and can also be observed visually the data carrier, the first carrier main surface of the carrier of the module can be provided with print in order to achieve an optical effect. However, it can also be very advantageous if further module connecting contacts arranged in the area of the first carrier main surface are connected to the carrier of the module and are adapted to cooperate with mating contacts with which they are engageable from outside the data carrier. Thus, it is possible to use a so-called dual-purpose chip as the component in such a data carrier, whose module connecting contacts arranged in the area of the second carrier main surface are connected to the coil connecting contacts of a coil, which has been provided for the contactless data exchange between the dual-purpose chip and a write/read station and, if desired, for the contactless power supply to the dual-purpose chip, and whose further module connecting contacts arranged in the area of the first carrier main surface have been provided for the contact-bound data exchange between the dual-purpose chip and a write/read station and for the contact-bound data exchange between the dual-purpose chip and a write/read station and for the contact-bound power supply to the dual-purpose chip.

Data carriers in accordance with the invention can serve different purposes and can have different shapes, for example, a key shape, a bar shape and other shapes. In this respect it is to be noted that in these forms of data carriers in accordance with the invention said body surface need not necessarily be the body bounding surface having the largest surface area. In the case of a bar shape the body bounding surface referred to as said body surface can be formed by an end face of the bar-shaped data carrier. This also applies to a key-shaped data carrier as well as to data carriers of other shapes. A specially preferred variant of a data carrier in accordance with the invention is characterized in that the data carrier takes the form of a chip card.

According to the invention a method of the type defined in the second paragraph is characterized in that during the manufacture of the data carrier body the coil turns and the coil connecting contacts of the coil, at least in their area adjacent the component, are arranged in a winding level zone situated outside the component level zone, and channels are formed in the data carrier body by material removal, which channels extend transversely to said body surface and are enclosed by the data carrier body over their whole length, each of which channels extends up to a coil connecting contact and, prior to the placement of the module in the data carrier body, is accessible from the exterior via its end which is remote from the two coil connecting contact, and in each channel an electrically conductive connecting means is introduced, and when the module is placed in the data carrier body each module connecting contact connected to the carrier of the module is connected to a facing coil connecting contact in an electrically conductive manner by the connecting means introduced into a channel. By means of such a method in accordance with the invention data carriers in accordance with the invention can be manufactured very cheaply and reliably in mass production quantities with a high quality and a high precision.

In a method in accordance with the invention, a pin made of an electrically conductive material and introduced into a channel of the data carrier may be arranged in each channel as an electrically conductive connecting means. However, it has proved to be very advantageous if a pasty or liquid electrically conductive substance is introduced into each channel as the electrically conductive connecting means. This is advantageous for a simple introduction of the electrically conductive connecting means. Moreover, this has proved to be advantageous because each channel is wholly filled with the electrically conductive substance, which is advantageous both in view of a high mechanical stability and in view of a proper electrical connection.

In a method in accordance with the invention as defined in the preceding paragraph it has proved to be particularly advantageous if an electrically conductive adhesive is introduced into each channel as the electrically conductive substance which forms the electrically conductive connecting means. In this way, it is achieved that the connecting means form not only the electrical connection but also for mechanically securing a module to the data carrier body because the electrically conductive adhesive forms a proper and stable adhesive joint with the module connecting contacts and thus secures the module to the data carrier body.

In a method in accordance with the invention, in which a pasty or liquid electrically conductive substance is introduced into each channel as the electrically conductive connecting means, it has proved to be particularly advantageous if at its end which is remote from its adjacent coil connecting contact each channel is provided with a pocket which extends in a lateral direction away from the channel and which is adapted to receive a surplus of electrically conductive substance. In this way, it is achieved that during production of a data carrier surplus electrically conductive substance introduced into a channel can escape to and can be taken up in the pocket which extends away from the channel in a lateral direction, thereby precluding undesirable soiling as a result of a possible surplus of electrically conductive substance.

In a method in accordance with the invention it has further proved to be very advantageous if in the manufactured data carrier a stepped recess is formed by material removal, which recess terminates in said body surface and has a cross-sectionally larger first recess portion, which adjoins said body surface and is bounded by an annular bounding surface parallel to said body main surface, and a cross-sectionally smaller second recess portion, which adjoins the first recess portion at the side which is remote from said body surface, and in the manufactured data carrier body channels are formed by material removal, which channels each extend from the annular bounding surface of the first recess portion to a coil connecting contact through the data carrier body, and the module is placed into the recess with the component and the module connecting contacts facing forward, each module connecting contact connected to the carrier of the module being connected to a facing coil connecting contact in an electrically conductive manner by the electrically conductive connecting means introduced into a channel. Such an method has proved to be very favorable for a very low-cost production of a data carrier.

With respect to the material removal in order to form the recess and the channels, it has proved to be particularly advantageous if the material removal for the formation of the recess and the channels is effected by means of a milling operation. In this way a comparatively large volume of material can be removed very rapidly and very precisely, enabling tolerances of only a few micrometers to be maintained.

In a method in accordance with the invention, in which a recess and ducts from the recess to the coil connecting contacts are formed, it has proved to be particularly advantageous if a test device for testing whether the coil is in good working order is operationally connected to the coil connecting contacts via the channels before the module is placed in the recess. This has the advantage that during production of a data carrier the coil connecting contacts can be made accessible from the outside through the recess and the channels, so that a test device can be connected to the coil connecting contacts in an electrically conductive manner in order to test whether a coil incorporated and embedded in a data carrier body is in good working order. The module, which is expensive in comparison with the other data carrier parts, is not mounted in the data carrier body until a positive test result has been obtained. Conversely, in the case of a negative test result, the data carrier body including the defective coil embedded therein but without a module is rejected, so that no module is wasted unnecessarily, which is very advantageous in view of a low-cost production of a data carrier.

In a method in accordance with the invention it has also proved to be very advantageous if before the module is mounted in the recess a hot-melt adhesive is applied in a peripheral area of the second carrier main surface of the carrier of the module and after the module has been mounted in the recess a heating die of a heating device is placed onto the first carrier main surface of the carrier of the module. This is advantageous for securing the module to the data carrier body by means of its carrier in a very reliable manner.

In a method in accordance with the invention it also proved to be very advantageous if the coil turns and the coil connecting contacts of the coil are formed on a carrier foil and subsequently the carrier foil, with the coil turns and the coil connecting contacts of the coil formed on it, is stacked with at least one further foil, the coil turns and the coil connecting contacts of the coil then being interposed between the carrier foil and a cover foil, and subsequently the stacked foils are laminated by means of a lamination process in order to form the data carrier body. In this way, it is achieved that the advantages known from a conventional and customary lamination technique can also be utilized in a method in accordance with the invention.

In the above context it has proved to be particularly advantageous if a polycarbonate foil is used as the carrier foil on which the coil turns and the coil connecting contacts of the coil are formed. In practice, such a polycarbonate foil has proved to be particularly advantageous because in the lamination process the coil together with its coil connecting contacts is uniformly pressed into such a foil and, as a result, the coil together with its coil connecting contacts is embedded in the finished data carrier body substantially without any mechanical loads and stresses.

In this respect, it has further proved to be very advantageous if a polyvinyl chloride foil is used as the cover foil which directly adjoins the coil turns and the coil connecting contacts of the coil during stacking of the foils. When such a polyvinyl chloride foil is used as a cover foil this enhances the uniform pressing-in and embedding of the coil.

In this respect, it has also proved to be very advantageous if the coil turns and the coil connecting contacts of the coil are formed by depositing a conductive material on the carrier foil in a screen-printing process. In this way, the advantages of screen-printing processes, the use of which for the fabrication of coils for data carriers is known per se, are also utilized advantageously in a method in accordance with the invention.

In the above context it has further proved to be very advantageous if the coil turns and the coil connecting contacts of the coil are formed by depositing a conductive silver paste on the carrier foil in a screen-printing process. This proves to be particularly advantageous in practice.

The above-mentioned aspects as well as further aspects of the invention will become apparent from the embodiments described hereinafter by way of examples and will be elucidated by means of these embodiments.

BRIEF DESCRIPTION OF THE DRAWINGS

The invention will now be described in more detail with reference to the drawings, which show four embodiments to which the invention is not limited.

DETAILED DESCRIPTION OF THE PREFERRED EMBODIMENTS

First of all, a possible variant of a method in accordance with the invention for manufacturing a data carrier in accordance with the invention, in the form of a chip card, will be described hereinafter with reference to FIGS. 1 to 8.

Figure 1:
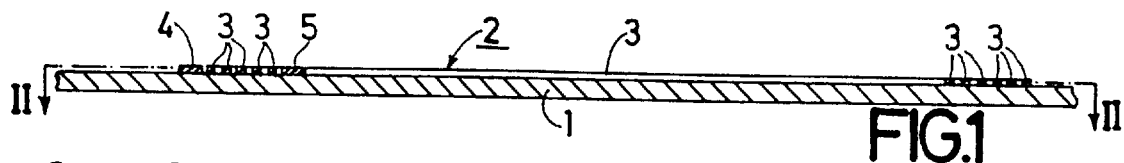
FIG. 1 is a cross-sectional view taken on the line I—I in FIG. 2 and showing a part of a large-area carrier foil which carries a multiplicity of coils, of which only one coil with its coil turns and coil connecting contacts is shown.

In a first process step a large-area carrier foil 1 shown in FIG. 1 is supplied to a screen-printing device. The carrier foil 1 has an area measuring 530 mm×660 mm. The thickness of the carrier foil 1 is approximately 125 $\mu$m. The carrier foil 1 is made of polycarbonate, which has proved to be very advantageous in the method described herein.

Figure 2:
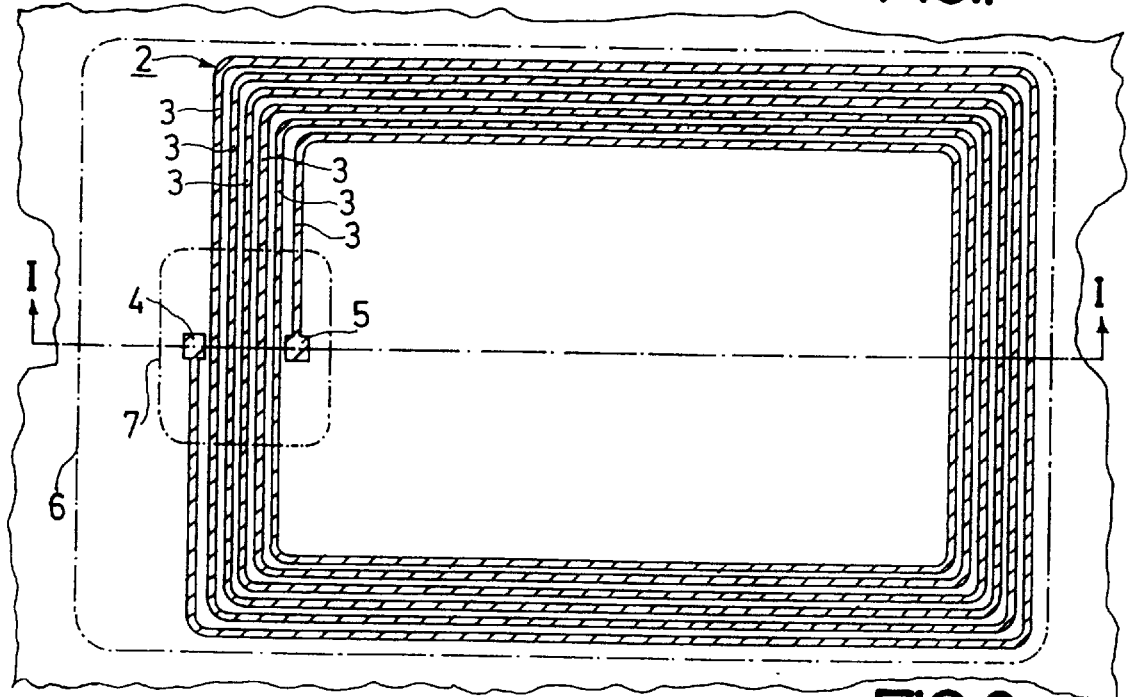
FIG. 2 is a sectional view taken on the line II—II in FIG. 1 and showing a coil with its coil turns and its two coil connecting contacts arranged on the large-area carrier foil.

In a subsequent process step a multiplicity of coils 2 are formed in the screen-printing device by means of a screen-printing technique in that a conductive material, in the present case a conductive silver paste, is applied to the carrier foil, which coils in the present case have a total of six coil turns 3 formed by conductor tracks. It is to be noted that the number and the shape of the coil turns 3 of the coils 2 may also differ. In the present case forty-eight coils are formed on the large-area carrier foil 1 at the same time, of which only one coil 2 is shown in FIGS. 1 and 2. The free end of the outermost coil turn and the free end of the innermost coil turn of each coil 2 has been provided with a rectangular coil connecting contact 4 and 5, respectively. The two coil connecting contacts 4 and 5 are likewise constituted by conductor tracks, which are formed on the carrier foil 1 similarly to the coil turns 3. The thickness of the coil turns 3 and of the coil connecting contacts 4 and 5 of the coil 2 is approximately 25 $\mu$m. In order to obtain this thickness by means of a conventional screen-printing technique it is also possible to carry out a plurality of printing cycles, in each of which subsequent printing cycle conductive silver paste is deposited on the conductive silver paste applied in the preceding printing cycle, so that the desired thickness of the coil turns 3 and the two coil connecting contacts 4 and 5 of the coil 3 can be obtained by successively depositing layers of conductive silver paste onto one another in a screen-printing process.

The above formation of the coils 2 on the carrier foil 1 yields the intermediate product shown in FIGS. 1 and 2.

With respect to FIG. 2, it is to be noted that in this Figure the outline of a chip card to be manufactured is shown by means of a dash-dot line 6 and the outline of a carrier of a module including a component in the form of a chip is shown by means of a further dash-dot line 7.

Figure 3:
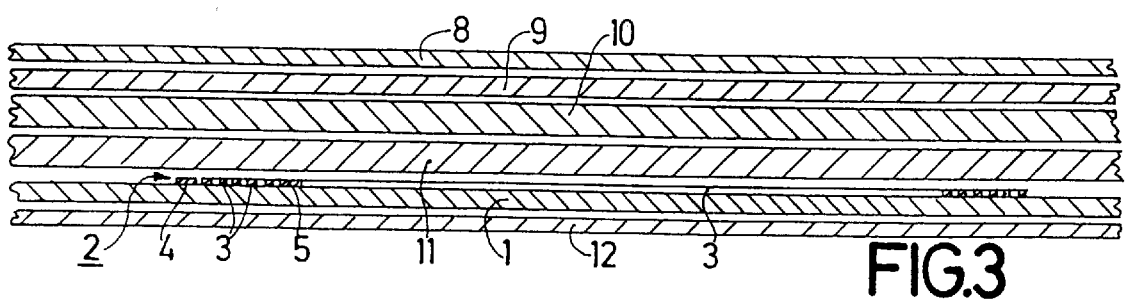
FIG. 3, in a manner similar to FIG. 1, shows a foil stack comprising a total of six large-area foils and including the large-area carrier foil as shown in FIG. 1.

In a subsequent process step—as is shown diagrammatically in FIG. 3—the large-area carrier foil 1 with the coils 2 formed on it is stacked together with, in the present case, five further foils 8, 9, 10, 11 and 12 in total, the coils 2 and, consequently, its coil connecting contacts 4 and 5 thus being interposed between the carrier foil 1 and a cover foil 11. With respect to the cover foil 11 it is to be noted that this is a polyvinyl chloride foil having a thickness of approximately 200 $\mu$m. The nominal areas of the further foils 8, 9, 10, 11 and 12 correspond to the area of the carrier foil 1.

As regards the foil 12 situated at that side of the surface of the carrier foil 1 which is remote from the coils 2, it is to be noted that this is also a polyvinyl chloride foil but that it has a thickness of only approximately 100 $\mu$m. Similarly to the foil 12, the foil 8 is also made of polyvinyl chloride and, similarly to the foil 12, it also has a thickness of approximately 100 $\mu$m. Similarly to the carrier foil 1, the foil 9 is also made of polycarbonate and, similarly to the foil 1, it also has a thickness of approximately 125 $\mu$m. Similarly to the foil 11, the foil 10 is also made of polyvinyl chloride and. similarly to the foil 11, it also has a thickness of approximately 200 $\mu$m.

Figure 4:
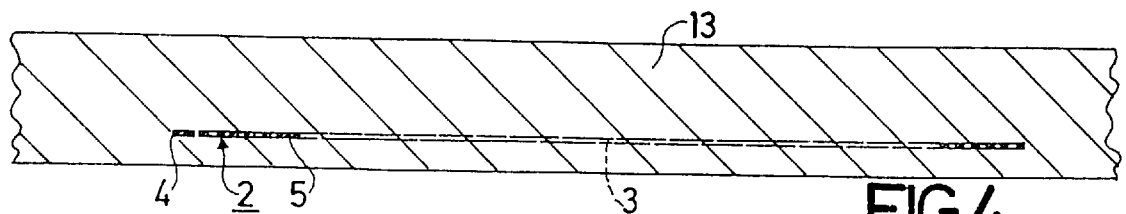
FIG. 4, in a manner similar to FIGS. 1 and 3, shows a large-area foil body obtained by lamination of the foil stack shown in FIG. 3, in which foil body a multiplicity of coils including their coil connecting contacts have been embedded.

After the foils 8, 9, 10, 11, 1 and 12 have been stacked, as can be see in FIG. 3, the stacked foils are laminated in a lamination process during a subsequent process step. In this lamination process the foils 8, 9, 10, 11, 1 and 12 are bonded to one another under the influence of pressure and heat, the individual foils being fused to one another in a controlled manner by a so-called foil homogenization, yielding a large-area foil body 13, as is shown in FIG. 4. In the large-area foil body 13, whose area measures 530 mm×660 mm, a plurality of coils 2 have been embedded, as is shown for a coil 2 in FIG. 4.

Figure 5:
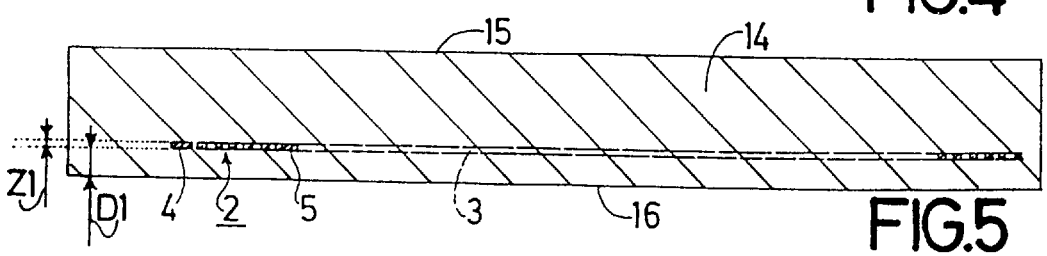
FIG. 5, in a manner similar to FIGS. 1, 3 and 4, shows a card body of a chip card punched out of the foil body shown in FIG. 4, in which card body a coil together with its two coil connecting contacts has been embedded.

In a subsequent process step a plurality of card bodies 14, to be regarded as data carrier bodies, are punched out of the large-area foil body 13 by means of a punching die in a punching operation. In the present case forty-eight card bodies 14 in total are punched from one foil body, of which one card body is shown in FIG. 5. The card body 14 shown in FIG. 5 is punched out of the large-area foil body 13 along the dash-dot line referenced 6 in FIG. 2.

The card body 14 is bounded by a first body main surface 15 and by a second body main surface 16 parallel to the first body main surface 15. The coil 2 is embedded in the card body 14, the coil turns 3 of the coil 2 as well as the two coil connecting contacts 4 and 5 of the coil 2 in the present case being incorporated in the card body 14 so as to extend parallel to the two body main surfaces 15 and 16 and being disposed in a winding level zone Z1 of the card body 14, which winding level zone extends transversely, in the present case perpendicularly, to the first body main surface 15 and, in the present case, also to the second body main surface 16. In the present case, the winding level zone Z1 in which the coil 2 is disposed is spaced at a distance D1 from the second body main surface 16. The distance D1 has a value of approximately 200 $\mu$m.

Figure 6:
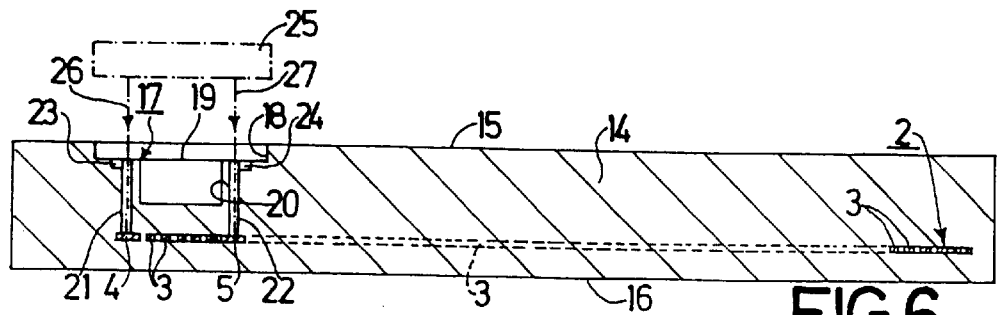
FIG. 6, in a manner similar to FIGS. 1, 3, 4 and 5, shows the card body of FIG. 5, which has a recess and two channels which extend from the recesses up to the two coil connecting contacts.

In a subsequent process step a stepped recess 17, as can be seen in FIG. 6, is formed in the manufactured card body 14 by removing material by means of a milling cutter in a milling operation. The recess 17 opens into the first body main surface 15. During said milling operation two milling steps are carried out, as a result of which a recess 17 is formed having a cross-sectionally larger first recess portion 18, which adjoins the first body main surface 15 and which is bounded, inter alia, by an annular bounding, surface 20 parallel to the first body main surface 15, and a cross-sectionally smaller second recess portion 19, which adjoins the first recess portion 18 at the side which is remote from the first body main surface 15.

Two channels 21 and 22 are made in a third milling step and in a fourth milling step of said milling operation, which channels each extend from the annular bounding surface 19 of the first recess portion 18 to a respective coil connecting contact 4 or 5 through the card body 14. The two channels 21 and 22 extend transversely to the first body main surface 15 and the second body main surface 16 of the card body 14, i.e. in the present case perpendicularly to the two body main surfaces 15 and 16, and are enclosed by the card body 14 over their whole length. Via their ends which are remote from the two coil connecting contacts 4 and 5 the two channels 21 and 22 are accessible from the exterior. At its end which is remote from the respective coil connecting contact 4 or 5 each channel 21 or 22 has a pocket 23 or 24, respectively, which extends in a lateral direction away from the respective channel 21 or 22.

In a following process step a test device 25, shown diagrammatically by means of a dash-dot line in FIG. 6, for testing whether the coil 2 is in good working order, is brought into operational contact with the two coil connecting contacts 1 and 5 of the coil 2 via the recess 17 and the two channels 21 and 22. This is effected in that two test contacts 26 and 27 of the test device 25 are brought into conductive contact with the two coil connecting contacts 4 and 5. By means of the test device 25 it is possible to determine whether the coil 2 is in good working order. When the test device 25 detects a defective or faulty coil 2 the relevant card body 14 together with the defective coil 2 embedded therein is rejected. When the test device 25 detects that the coil 2 is in good working order, the relevant card body 14 together with the coil 2 embedded therein is subsequently used for the fabrication of a chip card.

Figure 7:
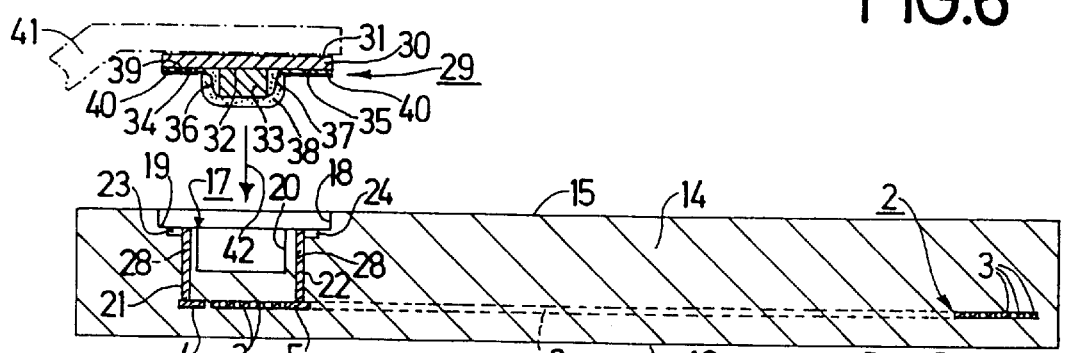
FIG. 7, in a manner similar to FIGS. 1, 3, 4, 5 and 6, shows the card body of FIG. 6, in which an electrically conductive adhesive has been introduced into the channels and a module is situated above the recess in the card body.

In a further process step an electrically conductive adhesive 28 in introduced into the two channels 21 and 22 by means of a dispenser device, as is shown in FIG. 7.

Already before the electrically conductive adhesive 28 is introduced into the two channels 21 and 22 a so-called module is processed in the method described here. Such a module 29 is shown diagrammatically in FIG. 7.

The module 29 comprises a plate-shaped carrier 30. The carrier 30 is bounded by a first carrier main surface 31 and by a second carrier main surface 32, which extends parallel to the first carrier main surface 31. The dimensions of the surface area of the carrier 30 substantially correspond to the cross-sectional dimensions of the first recess portion 18, i.e. they are only slightly smaller. The outlines of the first recess portion 18 and of the carrier 30 correspond to the shape of that indicated by means of the dash-dot line 7 in FIG. 2.

The module 29 further comprises a component in the form of a chip 33, which in known manner is formed by an integrated device. The chip 33 is attached to the carrier 30, i.e. to the second carrier main surface 32 of the carrier 30, for example by means of an adhesive joint. As is apparent from FIG. 7, the chip 33 is thus raised with respect to the second carrier main surface 32.

The module 29 further comprises two module connecting contacts 34 and 35 situated in the area of the second carrier main surface 32 and adapted to cooperate with the two coil connecting contacts 4 and 5. In the present case, the two module connecting contacts 34 and 35 are plate-shaped and are constituted by conductor tracks formed on the carrier 30. The two module connecting contacts 34 and 35—which is shown only diagrammatically in FIG. 7—are connected in an electrically conductive manner to chip connecting contacts of the chip 33 via a so-termed bonding wire 36 and 37 each, which connecting contacts are not shown in FIG. 7 and are generally referred to as pads among experts.

It is to be noted that the chip 33 and the two bonding wires 36 and 37 as well as one of the two module connecting contacts 34 and 35 are embedded in a package 38 formed by a synthetic-resin encapsulant.

A module 29 as described hereinbefore is, for example, supplied in large quantities by a manufacturer of such modules, said modules being supplied for example, in tape form.

In the course of the process described here a hot-melt adhesive 40 is applied in an annular portion 39 of the second carrier main surface 32 of the carrier 30, which portion 39 forms a peripheral area, in a further process step, as is indicated in FIG. 7.

Figure 8:
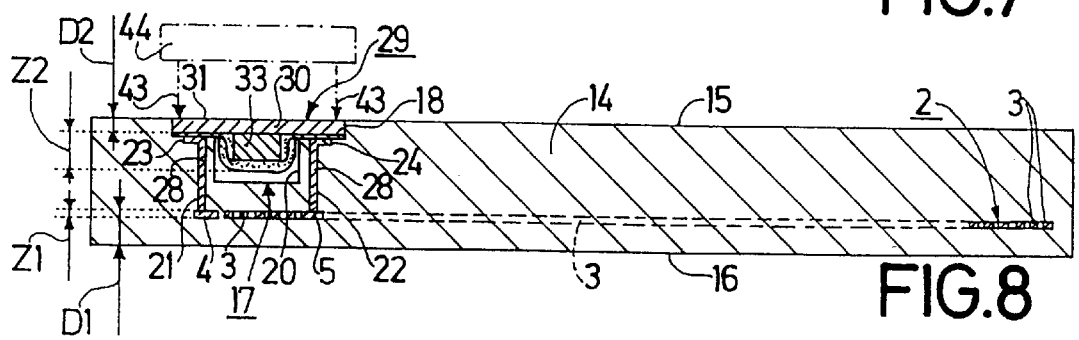
FIG. 8, in a manner similar to FIGS. 1, 3, 4, 5, 6 and 7, shows a finished chip card as a data carrier in accordance with a first embodiment of the invention, a module being accommodated in the recess of its card body.
Figure 9:
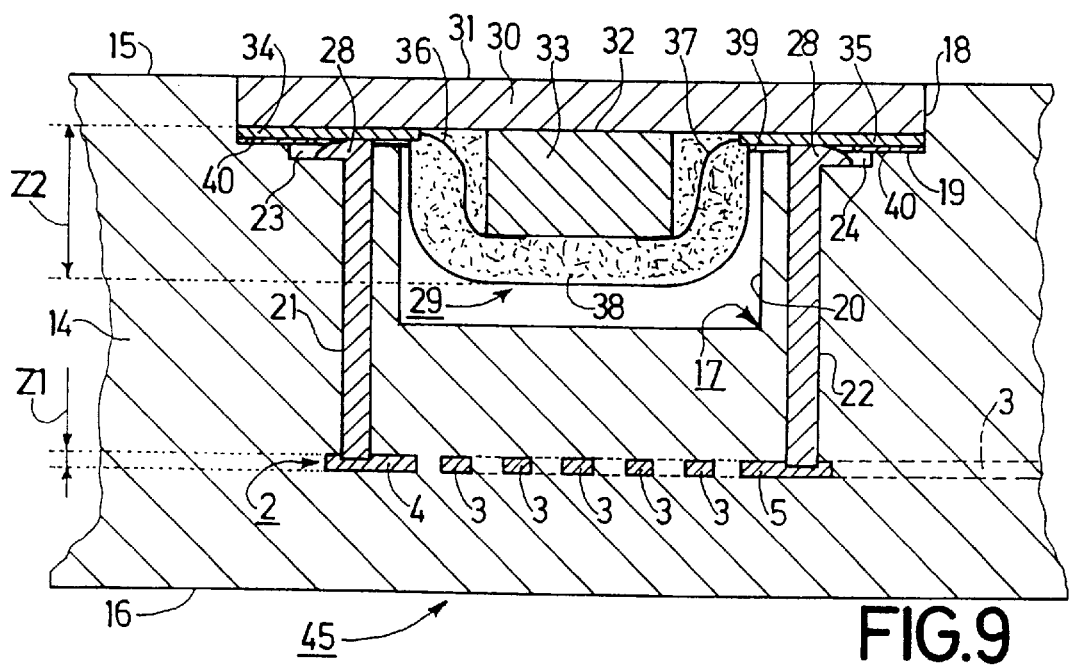
FIG. 9, in a manner similar to FIG. 8, shows the finished chip card with the module mounted in the recess, the card being shown only partly and to a scale four times as large as that of FIG. 8, the two module connecting contacts and the two coil connecting contacts being disposed opposite one another in a direction perpendicular to the body main surfaces and perpendicular to the carrier main surfaces, and being connected to one another in an electrically conductive manner by means of an electrically conductive adhesive present in a channel.

Subsequently, in a further process step the module 29 is placed in the recess 17 by means of a bonding arm 41, shown diagrammatically in dash-dot lines in FIG. 7, with the chip 33 and the two module connecting contacts 34 and 35 facing forward in the direction indicated by the arrow 42. Towards the end of this placement operation two plateshaped module connecting contacts 34 and 35 come into contact with the electrically conductive adhesive provided as the electrically conductive connecting means 28. By means of the adhesive introduced into the two channels 21 and 22 the two module connecting contacts 34 and 35 are joined to the two coil connecting contacts 4 and 5 so as to form electrically conductive and mechanically rigid connections. When the module 29 is placed into the recess 17 the two module connecting contacts 34 and 35 urge any surplus electrically conductive adhesive out of the two channels 21 and 22 in the area of the two pockets 23 and 24, surplus electrically conductive adhesive being taken up into the two pockets 23 and 24, as is shown in FIGS. 8 and 9. After the module 29 has been placed into the recess 17 of the card body 14 the process situation illustrated in FIG. 8 is obtained.

In a further process step a heating die 43, represented diagrammatically by means of two arrows in FIG. 8, which die forms part of a heating device 44, represented diagrammatically in dash-dot lines in FIG. 8, is placed onto the first carrier main surface 31 of the carrier 30 in order to activate the hot-melt adhesive 40. Subsequently, heat is transferred from the applied heating die 43 to the hot-melt adhesive 40 via the carrier 30, after which the heating die 43 is lifted off the carrier 30. During the subsequent cooling an adhesive joint is formed between the annular peripheral area 39 of the carrier 30 and the annular bounding surface 19 of the recess 17, which surface extends parallel to the two body main surfaces 15 and 16, said adhesive joint thus securing the module 29 to the card body 14. To secure the module 29 to the card body 14 it is also possible to use an adhesive as employed in the so-called cold bonding technique.

Upon completion of the last-mentioned process step a finished chip card 45 forming a data carrier in accordance with a first embodiment of the invention is obtained. This chip card 45 is shown partly in FIG. 9.

Upon mounting of the module 29 in the recess 17 of the card body 14 the first carrier main surface 31 of the carrier 30 lies against the first body main surface 15 of the card body 14 and, in the present case, the first carrier main surface 31 is then flush with the first body main surface 15. Furthermore, the second carrier main surface 32 of the carrier 30 is then remote from the first body main surface 15 of the card body 14 and faces the second body main surface 16 of the card body 14. Moreover, the chip 33 forming the component is then situated in a component level zone Z2 of the card body 14, which component level zone extends transversely, in the present case perpendicularly, to the first body main surface 15 and, in the present case, also perpendicularly to the second body main surface 16 of the card body 14. In this case the component level zone Z2 is spaced at a distance D2 from the first body main surface 15. The distance D2 now has a value of approximately 100 $\mu$m. In the present case, in which the chip 33 is embedded in a package 38, the component level zone Z2 of the card body 14 extends over the entire height dimension of the package 38. In the case that a module is used in which the chip forming the component does not have a package, or in which the package is substantially flush with the chip, it is adequate if the component level zone Z2 extends only up to the end level zone of the chip, which area is remote from the second carrier main surface of the carrier.

As is apparent from FIG. 9, the data carrier 46 has advantageously been constructed in such a manner that the coil turns 3 of the coil 2 and, in the present case also the two coil connecting contacts 4 and 5 of the coil 2, are disposed in a winding level zone ZI situated outside the component level zone Z2 and that by the electrically conductive connecting means 28 formed by the electrically conductive adhesive present in the two channels 21 and 22 the two module connecting contacts 34 and 35 are properly connected, both electrically and mechanically, to the two coil connecting contacts 4 and 5 through the component level zone Z2 and, in the present case, also beyond the component level zone Z2. This construction has the advantage that—although the chip 33 and its package 38 as well as the two module connecting contacts project from the same carrier main surface, i.e. the second carrier main surface 32 of the carrier 30 of the module 29—the presence of the chip 33 does not impose any restrictions on the arrangement of the coil turns 3 of the coil 2 and the construction of the coil 2 in the proximity of the chip 33 forming the component because the chip 33 together with its package 38 is disposed in a completely other level zone than the coil turns 3 of the coil 2 and the two coil connecting contacts 4 and 5 of the coil 2. Since in the data carrier 45 the electrical connection between the module connecting contacts 34, 35 and the coil connecting contacts 4, 5 as well as the mechanical connection between these contacts are made by means of the electrically conductive adhesive 28, which a reliable and aging-proof connection between the module connecting contacts 34, 35 and the coil connecting contacts 4, 5 is guaranteed.

Figure 10:
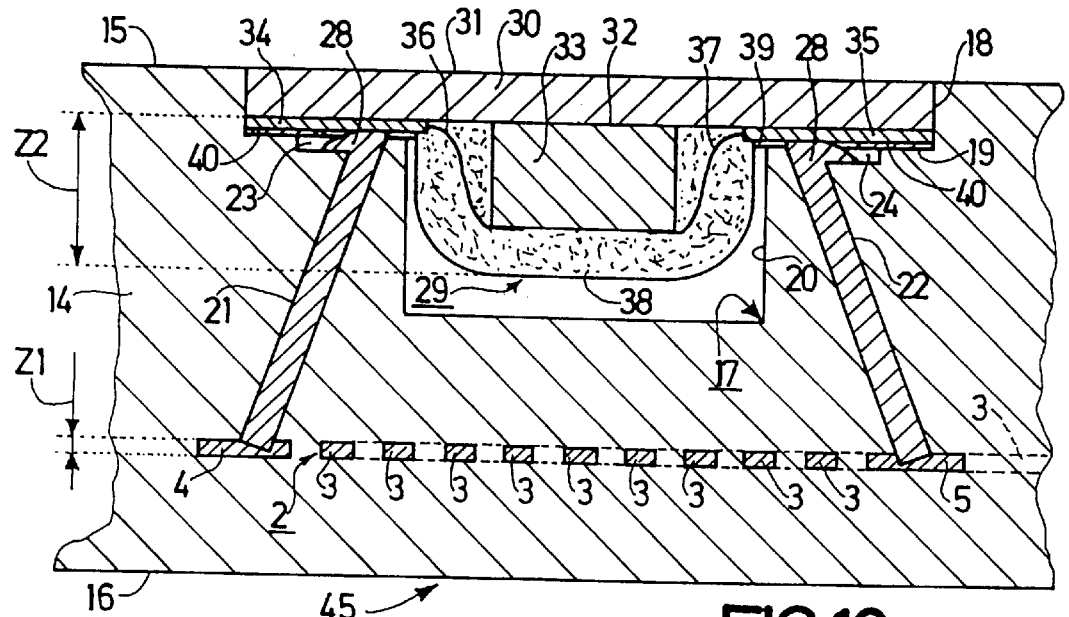
FIG. 10, in a manner similar to FIG. 9, shows a finished chip card as a data carrier in accordance with a second embodiment of the invention, which chip card also comprises a laminated card body and has two module connecting contacts and two coil connecting contacts which are disposed opposite one another in a director inclined with respect to the body main surfaces and inclined with respect to the carrier main surfaces, and which are connected to one another in an electrically conductive manner by means of an electrically conductive adhesive present in a channel.

FIG. 10 shows a chip card 45 forming a data carrier in accordance with a second embodiment of the invention. In this chip card 45 two channels 21 and 22 have been provided, which extend transversely to the first body main surface 15 and the second body main surface 16 of the card body 14 and, in the present case, they are inclined with respect to the two body main surfaces 15 and 16 in such a manner that the distance between the two channels 21 and 22 in the area of the two coil connecting contacts 4 and 5 is larger than in the area of the two module connecting contacts 34 and 35. This construction of the two channels has the advantage that a larger number of coil turns 3 can be arranged between the two coil connecting contacts 4 and 5 than in the case of a chip card 45 as shown in FIG. 9.

Figure 11:
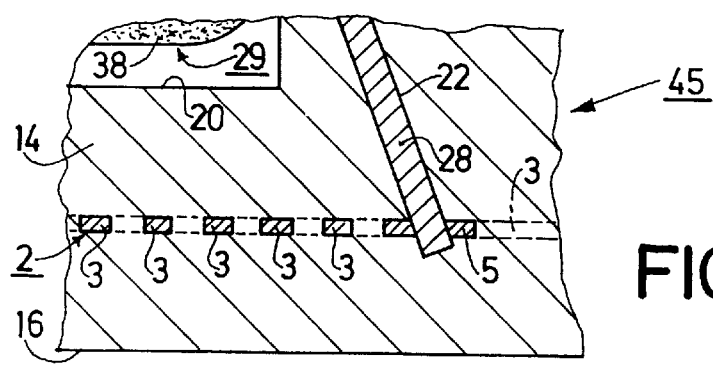
FIG. 11, in a manner similar to FIGS. 9 and 10, shows a part of a finished chip card as a data carrier in accordance with a third embodiment of the invention, which chip card comprises an injection-molded card body and has two module connecting contacts and two coil connecting contacts which are disposed opposite one another in a direction inclined with respect to the body main surfaces and inclined with respect to the carrier main surfaces, and which are connected to one another in an electrically conductive manner by means of an electrically conductive adhesive present in a channel, the two channels traversing the two coil connecting contacts.

FIG. 11 shows a chip card 45 forming a data carrier in accordance with a third embodiment of the invention. In this chip card 45 the two channels, of which only the channel 22 is shown in FIG. 11, are also inclined with respect to the first body main surface 15 and the second body main surface 16 of the chip card 45. In the chip card 45 shown in FIG. 11 both channels extend through the two coil connecting contacts, FIG. 11 showing only the coil connecting contact 5. The channels through the coil connecting contacts are formed in that during the fabrication of the chip card 45 the channels are milled out beyond the coil connecting contacts. The advantage of such a construction resides in the fact that the milling depth for the formation of the channels is comparatively non-critical and consequently requires a lower precision. By the introduction of the electrically conductive adhesive constituting the electrically conductive connecting means 28, which adhesive forms a firm bond with the coil connecting contacts which are traversed by the channels, it is achieved that also in this case a proper electrical and mechanical connection is realized between the coil connecting contacts and the module connecting contacts with the aid of the electrically conductive adhesive present in the channels.

Figure 12:
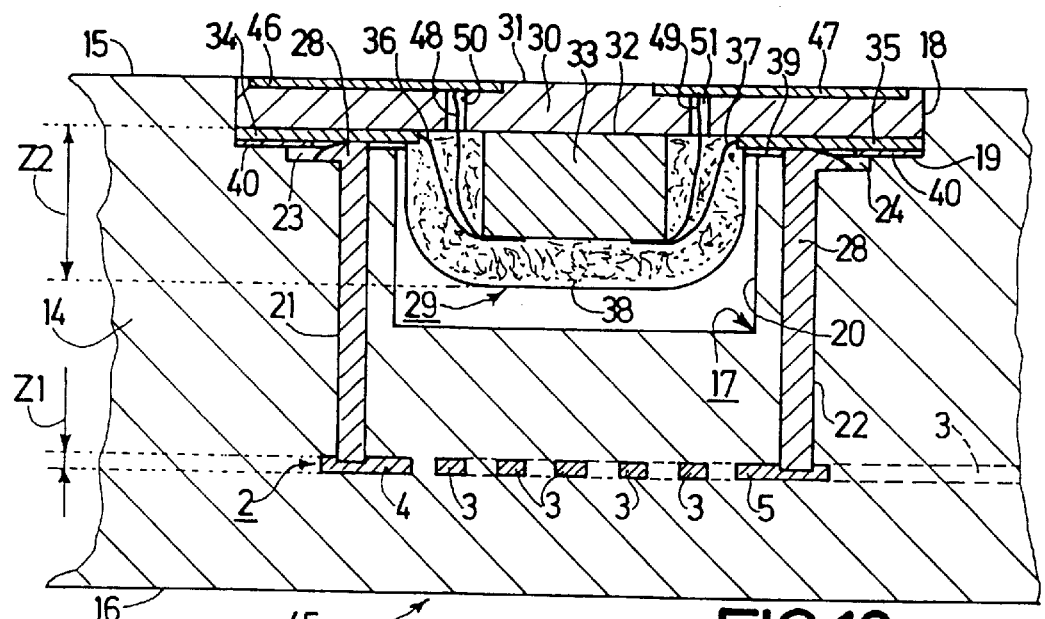
FIG. 12, in a manner similar to FIGS. 9 and 10, shows a finished chip card as a data carrier in accordance with a fourth embodiment of the invention, which chip card likewise comprises an injection-molded card body and has two module connecting contacts and two coil connecting contacts which are disposed opposite one another in a direction perpendicular to the body main surfaces and perpendicular to the carrier main surfaces, and which are connected to one another in an electrically conductive manner by means of an electrically conductive adhesive present in a channel, the carrier of the module in addition having further module connecting contacts which are accessible from the exterior.

FIG. 12 shows a chip card 45 forming a data carrier in accordance with a fourth embodiment of the invention. In this chip card 45 the construction of the two channels 21 and 22 and the construction of the two coil connecting contacts 4 and 5 and the two module connecting contacts 34 and 35, which are connected to one another by means of the electrically conductive adhesive in the two channels 21 and 22, are identical to the construction of these chip card elements in the chip card 45 as shown in FIG. 9.

In the chip card 45 as shown in FIG. 12, however, further module connecting contacts arranged in the area of the first carrier main surface 31 are connected to the carrier 30 of the module 29 and are adapted to cooperate with mating contacts with which they are engageable from outside the chip card 45. The chip card 45 of FIG. 12 has eight of such further module connecting contacts in total, only two of said further module connecting contacts 47 and 48 being shown in FIG. 12. As is shown for the two further module connecting contacts 47 and 48 in FIG. 10, the further module connecting contacts are connected to further chip connecting contacts (pads), not shown, of the chip 33 via further bonding wires, two of said further bonding wires 48 and 49 being shown in FIG. 12. The further bonding wires are passed through bores formed in the carrier 30, two of said bores 50 and 51 being shown in FIG. 12.

The chip 33 forming the component of the chip card 45 in FIG. 12 is a so-termed dual-purpose chip whose module connecting contacts 34 and 35 arranged in the area of the second carrier main surface 32 are connected to the coil connecting contacts 4 and 5 of the coil 2 provided for the contactless data exchange between the dual-purpose chip and a write/read station and, optionally, for the contactless transmission of power to the dual-purpose chip, and whose further module connecting contacts arranged in the area of the first carrier main surface 31 are adapted to provide the contact-bound data exchange between the dual-purpose chip and a write/read station for the contact-bound transmission of power to the dual-purpose chip.

In the chip card 45 as shown in FIG. 12 the component formed by the chip 33 including its package 38 and the coil 2 with its coil turns 3 and its two coil connecting contacts 4 and 5 are also disposed in different level zones, i.e. the component formed by the chip 33 including its package 38 is disposed in the component level zone Z2 and the coil 2 is disposed in the winding level zone ZI, which in the chip card 45 of FIG. 12 also yields the great advantage that—although the chip 33 and its package 38 and the two module connecting contacts 34 and 35 project from the same carrier main surface, i.e. the second carrier main surface 32 of the carrier 30 of the module 29—the presence of the chip 33 does not impose any restrictions on the arrangement of the coil turns 3 of the coil 2 and the construction of the coil 2 in the proximity of the chip 33.

The invention is not limited to the embodiments described hereinbefore by way of examples. For example, for manufacturing a data carrier body and for forming a recess in the data carrier body it is also possible to use other suitable techniques, for example etching techniques or laser techniques. Other suitable techniques are also available for manufacturing the coils, for example etching techniques. Moreover, two or more than two coils may be incorporated in a data carrier body. A module mounted in a data carrier need not necessarily be a component in the form of a chip, but the component may alternatively be a capacitor, a pressure-sensitive film switch, or the like. Furthermore, it is to be noted that the component in a chip card forming a data carrier in accordance with the invention need not necessarily comprise a single chip but it may alternatively comprise two or more chips. A chip card may, for example, also include two modules each comprising one chip or, alternatively, one module comprising two chips. In the embodiments described hereinbefore the module carriers are accessible at the location of the first body main surface of the card body, the first carrier main surface and the first body main surface in the chip cards in accordance with the three embodiments described above being flush; however. it is possible to have a chip card in which the first carrier main surface of the carrier of a module is covered with a cover layer, the outer bounding surface of this cover layer then being flush with the first body main surface of the card body of this chip card.

In a data carrier having an injection-molded data carrier and having a coil made of thin wire the coil turns can be disposed in one plane in such a manner that the coil connecting contacts as well as the coil turns are then disposed in a winding level zone Z1 over their whole extent, which zone corresponds to the wire diameter and is situated outside the component level zone Z2. This need not necessarily be so because the coil turns may also be disposed within the component level zone Z2 in their area which does not face and does not adjoin the component on the data carrier module, i.e. in a direction transverse to the body main surfaces of the module carrier, which can be achieved by a suitably bent or angled shape of the coil. In this respect it is essential that, at least in the area adjacent the component, the coil connecting contacts and the coil turns of the coil are disposed in a winding level zone Z1 outside the component level zone Z2.

Finally, an essential fact to be noted is that in all th embodiments of data carriers described within the scope of the present Application said body surface which bounds the data carrier body and in which the recess in which the module is mounted terminates is an externally accessible outer body surface. However, this need not be so because after the module has been mounted in data carriers in accordance with the described embodiments, in the case that this module is exclusively intended for contactless operation in a data carrier, said body surface may be provided with a cover layer, for example in the form of a cover foil, which can wholly cover the module and, in the case of a module intended for contact-bound operation in a data carrier, it may cover the module in such a manner that at least the further module connecting contacts remain exposed to allow cooperation with contact pins of a read/write device, or it may not at all cover such a module but merely said body surface. In the case of a such a construction the outer body surface of the data carrier body of a data carrier is formed by the outer surface of the cover layer.

I claim:

1. A data carrier comprising a data carrier body bounded by a body surface and incorporating a module and a coil, which coil is separate from the module and has coil turns and at least two coil connecting contacts, the module comprising a plate-shaped carrier, which extends substantially parallel to said body surface and which is bounded by a first carrier main surface facing said body surface and by a second carrier main surface substantially parallel to the first carrier main surface, and at least one component, which component is incorporated in the data carrier body, is connected to the carrier, is raised with respect to the second carrier main surface, and is disposed in a component level zone which extends transversely to said body surface, and at least two nodule connecting contacts connected to the carrier and arranged in the area of the second carrier main surface, at least in an area adjacent the component the coil turns and the coil connecting contacts of the coil being disposed in a winding level zone which extends transversely to said body surface, and which is situated outside the component level zone, each coil connecting contact being disposed opposite a module connecting contact in a direction transverse to the second carrier main surface, channels having been provided containing an electrically conductive substance which forms an electrically conductive connection between each module connecting contact and each opposite coil connecting contact, and at an end remote from the coil connecting contacts each channel having a pocket which extends in a lateral direction away from the channel and which is adapted to receive a surplus of the electrically conductive substance, whereby the electrically conductive substance has been introduced into the channels in a pasty or liquid condition and has dried after such an introduction.

2. A data carrier as claimed in claim 1, wherein the electrically conductive substance is an electrically conductive adhesive.

3. A data carrier as claimed as claimed in claim 1, wherein the data carrier has a stepped recess which terminates in said body surface and has a cross-sectionally larger first recess portion, which adjoins said body surface and is bounded by an annular bounding surface parallel to said body main surface, and a cross-sectionally smaller second recess portion, which adjoins the first recess portion at the side which is remote from said body surface and which accommodates the module, an annular portion of the second carrier main surface of the carrier of the module facing the annular bounding surface of the first recess portion, the module connecting contacts being disposed at least partly in the area of the annular portion of the second carrier main surface, the channels extending from the annular bounding surface of the first recess portion up to the coil connecting contacts through the data carrier body, and the pockets also extending from the annular bounding surface of the first recess portion and being open at the annular bounding surface.

4. A data carrier as claimed in claim 3, wherein the recess, the channels, and the pockets have been formed by means of a milling operation.

5. A data carrier as claimed in claim 1, wherein the coil turns and the coil connecting contacts of the coil are constituted by conductor tracks formed by means of a screen-printing process.

6. A data carrier as claimed in claim 5, wherein in the screen-printing process a conductive silver paste is used.

7. A data carrier as claimed in claim 1, wherein further module connecting contacts arranged in the area of the first carrier main surface are connected to the carrier of the module and are adapted to cooperate with mating contacts with which the further module connecting contacts are engageable from outside the data carrier.

8. A data carrier as claimed in claim 1, wherein the data carrier is constructed as a chip card.

9. A method of manufacturing a data carrier with a component module in a module level zone, in which method a data carrier body is manufactured, which data carrier body is bounded by a body surface and in which method during the manufacture of the data carrier body a coil having coil turns and at least two coil connecting contacts is incorporated in the data carrier body, which coil turns and coil connecting contacts, at least in an area adjacent the module level zone, are arranged in a winding level zone which extends transversely to said body surface, the module comprising a plate-shaped carrier, which is bounded by a first carrier main surface and by a second carrier main surface substantially parallel to the first carrier main surface, and a component, which is connected to the carrier and is raised with respect to the second carrier main surface, and at least two module connecting contacts connected to the carrier and arranged in the area of the second carrier main surface, the first carrier main surface then facing said body surface and the second carrier main surface then being remote from said body surface and the component then being disposed in a component level zone which extends transversely to said body surface, and each module connecting contact and each coil connecting contact then being disposed opposite one another in a direction transverse to the second carrier main surface and being connected in an electrically conductive manner, and channels being formed in the data carrier body by material removal, which channels extend transversely to said body surface and are enclosed by the data carrier body over their whole length, each of which channels extends up to a coil connecting contact and, prior to the placement of the module in the data carrier body, is accessible from the exterior via an end which is remote from the two coil connecting contact, and in each channel an electrically conductive substance is introduced in a pasty or liquid form that dries after such an introduction, at the end remote from the coil connecting contacts each channel having a pocket which extends in a lateral direction away from the channel and which receives a surplus of the electrically conductive substance, and when the module is placed in the data carrier body each module connecting contact connected to the carrier of the module is connected to a facing coil connecting contact through the electrically conductive substance.

10. A method as claimed in claim 9, wherein the electrically conductive substance is an electrically conductive adhesive.

11. A method as claimed in claim 9, wherein in the data carrier a stepped recess is formed by material removal, which recess terminates in said body surface and has a cross-sectionally larger first recess portion, which adjoins said body surface and is bounded by an annular bounding surface parallel to said body main surface, and a cross-sectionally smaller second recess portion, which adjoins the first recess portion at a side which is remote from said body surface, the channels each extending from the annular bounding surface of the first recess portion to a coil connecting contact through the data carrier body.

12. A method as claimed in claim 11, wherein the material removal for the formation of the recess, the channels to the coil connecting contacts, and the pockets is effected by means of a milling operation.

13. A method as claimed in claim 11, wherein a test device for testing whether the coil is in good working order is operationally connected to the coil connecting contacts via the channels before the module is placed in the recess.

14. A method as claimed in claim 11, wherein before the module is placed in the recess a hot-melt adhesive is applied in a peripheral area of the second carrier main surface of the carrier of the module, and after the module has been placed in the recess a heating die of a heating device is placed onto the first carrier main surface of the carrier of the module to activate the hot-melt adhesive.

15. A method as claimed in claim 9, wherein the coil turns and the coil connecting contacts of the coil are formed on a carrier foil and subsequently the carrier foil, with the coil turns and the coil connecting contacts of the coil formed on it, is stacked with at least one further foil, the coil turns and the coil connecting contacts of the coil then being interposed between the carrier foil and a cover foil, and subsequently the stacked foils are laminated by means of a lamination process in order to form the data carrier body.

16. A method as claimed in claim 15, wherein a polycarbonate foil is used as the carrier foil.

17. A method as claimed in claim 16, wherein a polyvinyl chloride foil is used as the cover foil which directly adjoins the coil turns and the coil connecting contacts of the coil during stacking of the foils.

18. A method as claimed in claim 15, wherein the coil turns and the coil connecting contacts of the coil are formed by depositing a conductive material on the carrier foil in a screen-printing process.

19. A method as claimed in claim 18, wherein the coil turns and the coil connecting contacts of the coil are formed by depositing a conductive silver paste on the carrier foil in the screen-printing process.

20. A data carrier comprising:
a data carrier body bounded by a body surface;
a component module with at least one component and with component contacts;
a coil with coil contacts,
said at least one component being comprised in a component level zone extending traversely to said body surface, and said coil with coil contacts at least in an area adjacent said at least one component being comprised in a coil level zone extending traversely to said body surface and outside said component level zone;
at least two electrically conductive channels connecting at least two of said component contacts to said coil contacts, said channels being filled with a dried electrically conductive substance that has been introduced into said channels in a pasty or a liquid form and has dried after such an introduction; and
pockets at ends of said channels remote from said coil contacts, said pockets extending in a lateral direction away from said channels and being adapted to receive a surplus of said electrically conductive substance when in said pasty or liquid form.

* * * * *